(12) United States Patent
Braun et al.

(10) Patent No.: US 11,271,299 B2
(45) Date of Patent: Mar. 8, 2022

(54) METHOD AND ARRANGEMENT FOR ANTENNA CALIBRATION (71) Applicant: Telefonaktiebolaget LM Ericsson (publ), Stockholm (SE)

(72) Inventors: Christian Braun, Vallentuna (SE); Vimar Björk, Gothenburg (SE); Jonas Karlsson, Upplands Väsby (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 535 days.

(21) Appl. No.: 16/315,005

(22) PCT Filed: Jul. 6, 2016

(86) PCT No.: PCT/SE2016/050691
§ 371 (c)(1),
(2) Date: Jan. 3, 2019

(87) PCT Pub. No.: WO2018/009106
PCT Pub. Date: Jan. 11, 2018

(65) Prior Publication Data
US 2020/0014105 A1 Jan. 9, 2020

(51) Int. Cl.
*H01Q 3/26* (2006.01)
*H04B 17/14* (2015.01)
*H04B 17/21* (2015.01)

(52) U.S. Cl.
CPC .......... *H01Q 3/267* (2013.01); *H01Q 3/2652* (2013.01); *H04B 17/14* (2015.01); *H04B 17/21* (2015.01)

(58) Field of Classification Search
CPC ...... H01Q 3/267; H01Q 3/2652; H04B 17/14; H04B 17/21; G01R 29/10
See application file for complete search history.

(56) References Cited

U.S. PATENT DOCUMENTS 5,657,023 A 8/1997 Lewis et al.
2004/0219892 A1\* 11/2004 Vaidyanathan ...... H01Q 3/2605
455/103

(Continued)

OTHER PUBLICATIONS

International Search Report and Written Opinion issued in International Application No. PCT/SE2016/050691, dated Feb. 21, 2017, 12 pages.

(Continued)

*Primary Examiner* — Kabir A Timory
(74) *Attorney, Agent, or Firm* — Rothwell, Figg, Ernst & Manbeck, P.C.

(57) ABSTRACT

In a method for calibrating at least two cross coupled antenna element groups in an antenna array, calibrating (S1) the antenna elements within each group of antenna elements. Further, in a respective calibration transceiver in each group, measuring (S2) a coupled signal within each group and a cross-coupled signal originating in another of the at least two groups. In addition, determining (S3) a respective relative phase and amplitude difference between said at least two groups based on the measured coupled signal and said cross-coupled signal, and determining (S4) the true phase and amplitude difference between the at least two groups based on the determined respective relative phase and amplitude differences. Finally, calibrating (S5) the at least two antenna groups based on the determined true phase and amplitude difference.

15 Claims, 6 Drawing Sheets

(56) References Cited

U.S. PATENT DOCUMENTS

2012/0154206 A1   6/2012   Medina Sanchez
2014/0133470 A1   5/2014   McGowan et al.

OTHER PUBLICATIONS

Shipley, C. et al., "Mutual Coupling-Based Calibration of Phased Array Antennas", Phased Array Systems and Technology, 2000 Proceedings, 2000 IEEE International Conference on Dana Point, CA, May 21, 2000 (pp. 529-532).

* cited by examiner

METHOD AND ARRANGEMENT FOR ANTENNA CALIBRATION

CROSS REFERENCE TO RELATED APPLICATION(S)

This application is a 35 U.S.C. § 371 National Stage of International Patent Application No. PCT/SE2016/050691, filed Jul. 6, 2016.

TECHNICAL FIELD

The proposed technology generally relates active antenna systems, AAS, for Long Term Evolution, LTE, and 5G and beam forming. More specifically to antenna calibration of large antenna arrays and antenna calibration between antennas, providing for coherent multi-point transmission (or coherent D-MIMO) operation.

BACKGROUND

Beam forming for an antenna array requires the downlink, DL, branches and the uplink, UL, branches to be phase calibrated relative to each other. A common way to phase calibrate an antenna array is to use a coupler means that taps off a small portion of the transmitted signal from each branch to a common point. At the common point, the phase difference between the coupled paths of each transmitter antenna is measured and appropriate calibration compensation can be applied to each transmitter branch. Due to reciprocal behavior, the same coupler means can be used to inject a signal into each receiver path and thereby calibrate the receiver branches of the antenna array.

A requirement on the coupler means is that the coupled path from each branch to the common measurement point is equal in amplitude in phase. Any amplitude/phase error in the coupler arrangement directly degrades the calibration result It is a great design challenge to design a phase matched coupler means for a large antenna array. Due to dimensions of the array, there is a physical distance difference from each antenna branch to a common measurement point, this respective distance to the common measurement point being different for the closest antenna versus the farthest antenna. The physical distance can be made equal electrically by introducing meandering of a transmission line (or coaxial cable) so that the electrical lengths are equal. But even with such an arrangement, temperature differences across the array, mainly due to heating from the active electronics, causes phase drift in the transmission lines that compromises the calibration accuracy.

Also, routing of the signals to a common port consumes space and also has the risk of creating cross talk problems.

Consequently, there is a need for improving the calibration of antenna arrays.

SUMMARY

It is an object to provide a method and arrangement for improved antenna calibration in antenna arrays, which obviates the above described problems.

This and other objects are met by embodiments of the proposed technology.

According to a first aspect, there is provided a method for calibrating at least two cross coupled antenna element groups in an antenna array. Firstly, the antenna elements within each group of antenna elements are calibrated, and in a respective calibration transceiver in each group, a coupled signal within each group is measured and a cross-coupled signal originating in another of the at least two groups is measured. In addition, a respective relative phase and amplitude difference is determined between the at least two groups based on the measured coupled signal and the measured cross-coupled signal. Further, the true phase and amplitude difference between the at least two groups is determined based on the determined respective relative phase and amplitude differences, and the at least two antenna groups are calibrated based on the determined true phase and amplitude difference.

According to a second aspect, there is provided a calibration apparatus configured to calibrate at least two groups of cross coupled antenna elements in an antenna array, wherein the apparatus is configured to calibrate each group of antenna elements, and in a respective calibration transceiver connectable to each said group, measure a coupled signal within each group and a cross-coupled signal originating in another of said at least two groups. Further, the calibration apparatus is configured to determine a respective relative phase and amplitude difference between said at least two groups based on said measured coupled signal and said cross-coupled signal, and determine the true phase and amplitude difference between the at least two groups based on the respective determined relative phase and amplitude difference. Finally, the apparatus is configured to calibrate the at least two antenna groups based on the determined true phase and amplitude difference.

An advantage of the proposed technology is to enable improved calibration of antenna arrays.

Other advantages will be appreciated when reading the detailed description.

BRIEF DESCRIPTION OF THE DRAWINGS

The embodiments, together with further objects and advantages thereof, may best be understood by making reference to the following description taken together with the accompanying drawings, in which.

ABBREVIATIONS

AAS Active Antenna System
Cal TRX Calibration signal transmitter and receiver
Digital Digital radio ASIC
DL DownLink
FDD Frequency Division Duplex
LTE Long Term Evolution
MIMO Multiple Input Multiple Output
TDD Time Division Duplex
TRX Normal radio transmitter and receiver circuitry
UL UpLink

DETAILED DESCRIPTION

Throughout the drawings, the same reference designations are used for similar or corresponding elements.

As mentioned previously, one inherent problem with calibrating antenna arrays is the lack of knowledge about the effect of differing physical distance between antenna branches and common measurement points during calibration. This prevents an efficient calibration procedure and puts high demand on properly identifying and determining phase and amplitude differences caused by differing path lengths. There is thus a need for an improved calibration method. In particular, as the use of large antenna arrays is increasing, the problem will increase in the same way.

The inventors have identified the possibility to introduce a cross coupling (wirebound) between groups of calibrated antenna elements, and assuming a reciprocity relation for the cross coupling path, determining relative as well as actual or true phase and amplitude differences between groups of calibrated antenna elements. The antenna elements within each antenna group are coupled and calibrated via a local calibration coupler. In this context, the term true phase and amplitude relates to the phase and amplitude at the air interface or even the far field patterns.

Briefly, the current disclosure presents a method to use local calibration coupler means combined with a cross-coupling means to enable full calibration of large antenna arrays or even to calibrate physically separated antennas towards each other. The cross coupled path is used to measure phase/amplitude differences between the different parts of the large array. By performing a special measurement sequence, the impact of amplitude and phase of the cross coupled path can be completely eliminated, without needing knowledge of the actual amplitude and phase error introduced by the coupled path. This can be performed both for uplink calibration and for downlink calibration, with only minor modifications of a common procedure.

It should be noted that the calibration coupler means for each antenna group still needs to be carefully designed for amplitude and phase equality for each coupled path. This design problem is however local to each antenna group and is easier to handle due to small physical distances and high level of integration within each antenna group.

In essence, the large antenna array is divided into antenna groups; each antenna group is calibrated by its local calibration coupler means. The antenna groups are then calibrated toward each other by the cross-coupling means and the special measurement sequence.

Figure 1:
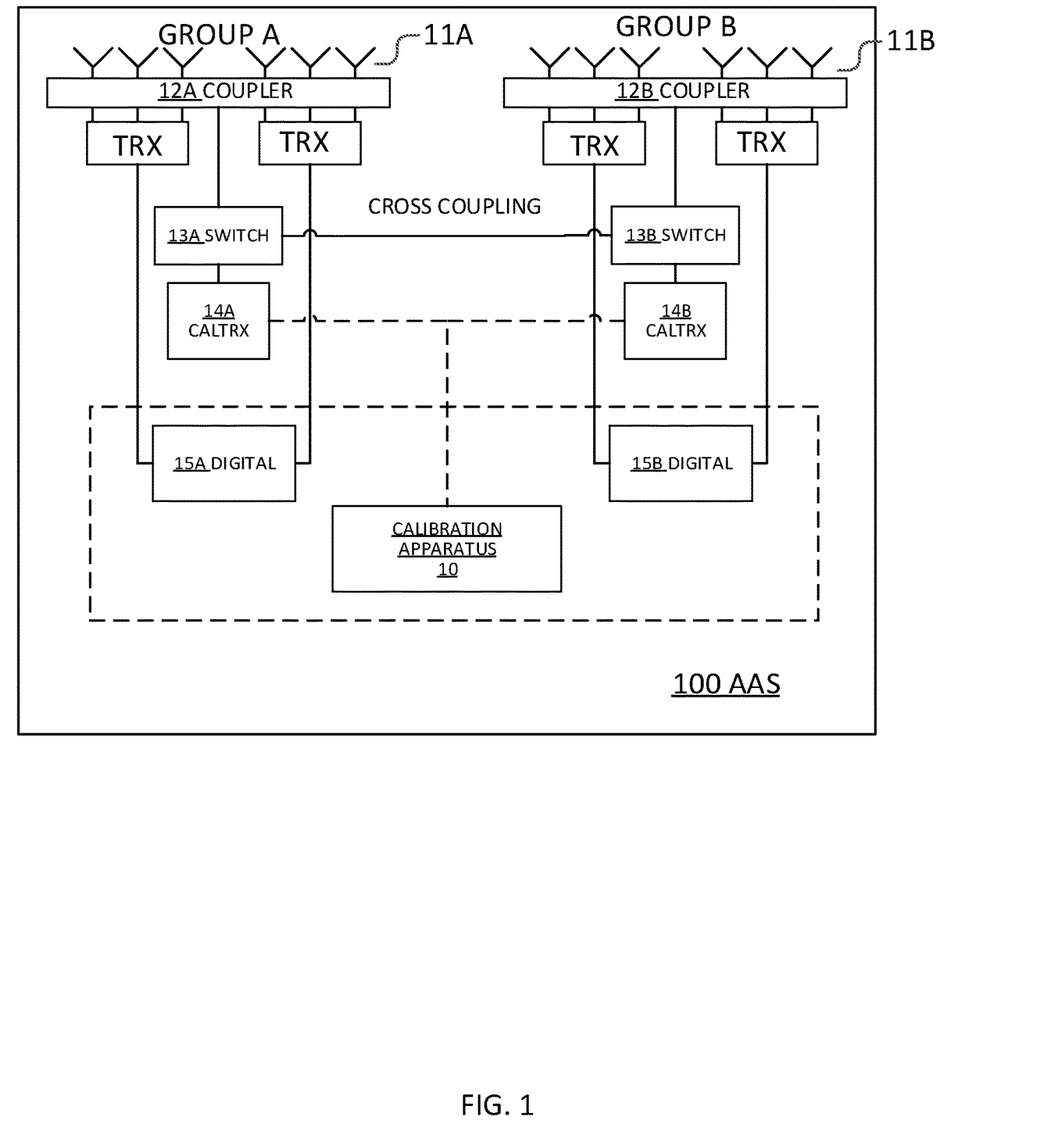
FIG. 1 illustrates an embodiment of the current disclosure.

With reference to FIG. 1, an embodiment of an active antenna system, AAS; 100 according to the present disclosure will be described. The AAS 100 comprises at least two groups of antenna elements Group A, Group B, each of which is configured according to the following. It is understood that the AAS 100 may comprise other components as well, that are necessary for the normal functioning of the AAS. The first group of antenna elements Group A comprises a plurality of antenna elements 11A, which are all interconnected or coupled via a local coupler unit or means 12A. Further, the antenna elements 11A are connected to one or more transceiver units TRX, for enabling transmitting and receiving signals on the antenna elements 11A. The coupler unit 12A is further connected to a calibration transceiver 14A, via a cross coupling unit 13A. The transceiver units TRX are connected to a digital ASIC 15A. In a corresponding manner, the at least second antenna element group Group B comprises a plurality of antenna elements 11B, which are interconnected or coupled via a local coupler unit or means 12B. Further, the antenna elements 11B are connected to one or more transceiver units TRX, for enabling transmitting and receiving signals on the antenna elements 11B. The coupler unit 12B is further connected to a calibration transceiver unit 14B, via a cross coupling unit 13B. The transceiver units TRX are connected to a digital ASIC 15B. The two antenna element groups Group A, Group B are cross coupled via their respective cross coupling units 13A, 13B, to enable measuring cross coupled signals from one group in the other group. In addition, the AAS 100 includes a calibration apparatus 10 according to the current disclosure.

Figure 2:
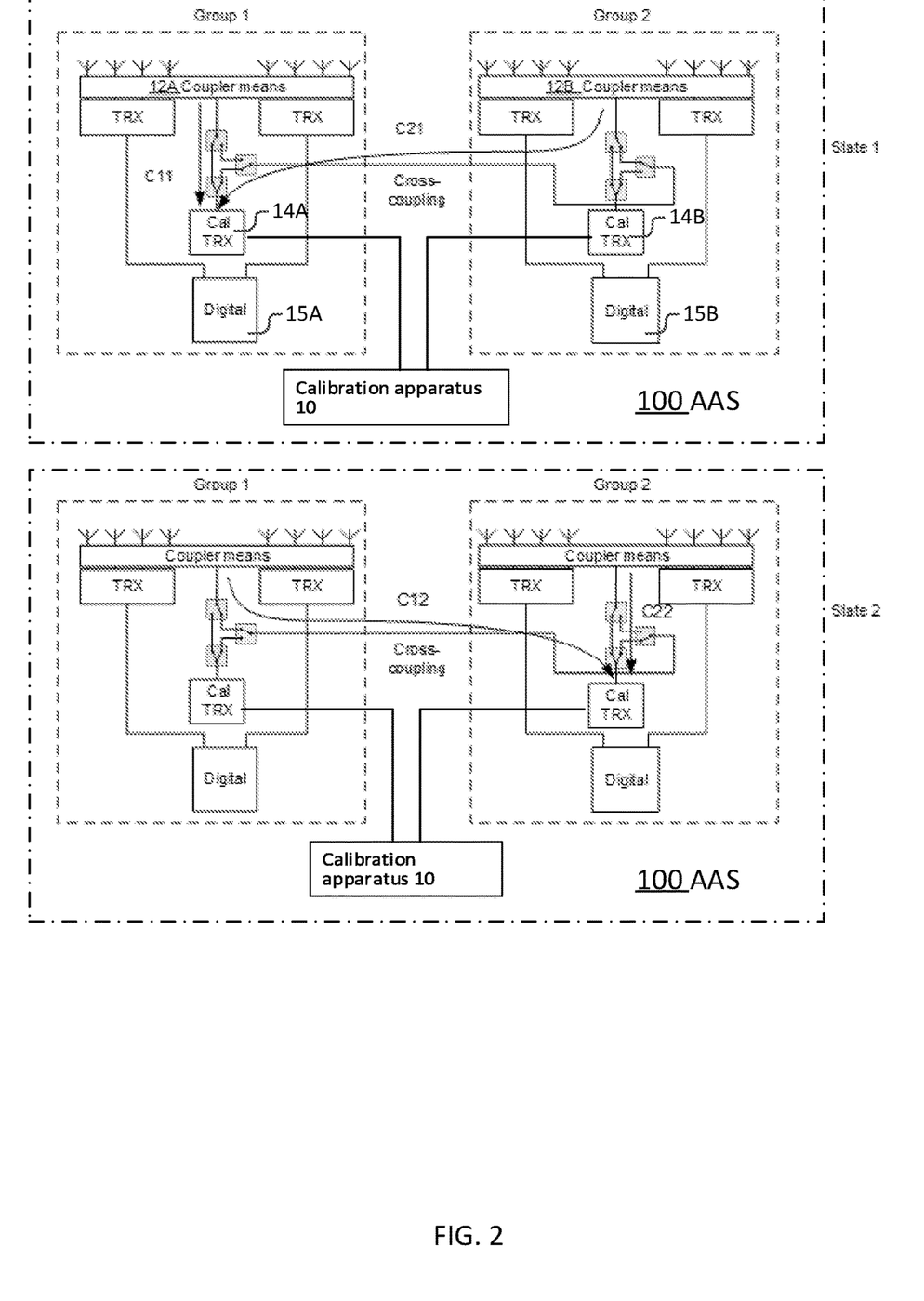
FIG. 2 illustrates a further embodiment of the current disclosure.
Figure 3:
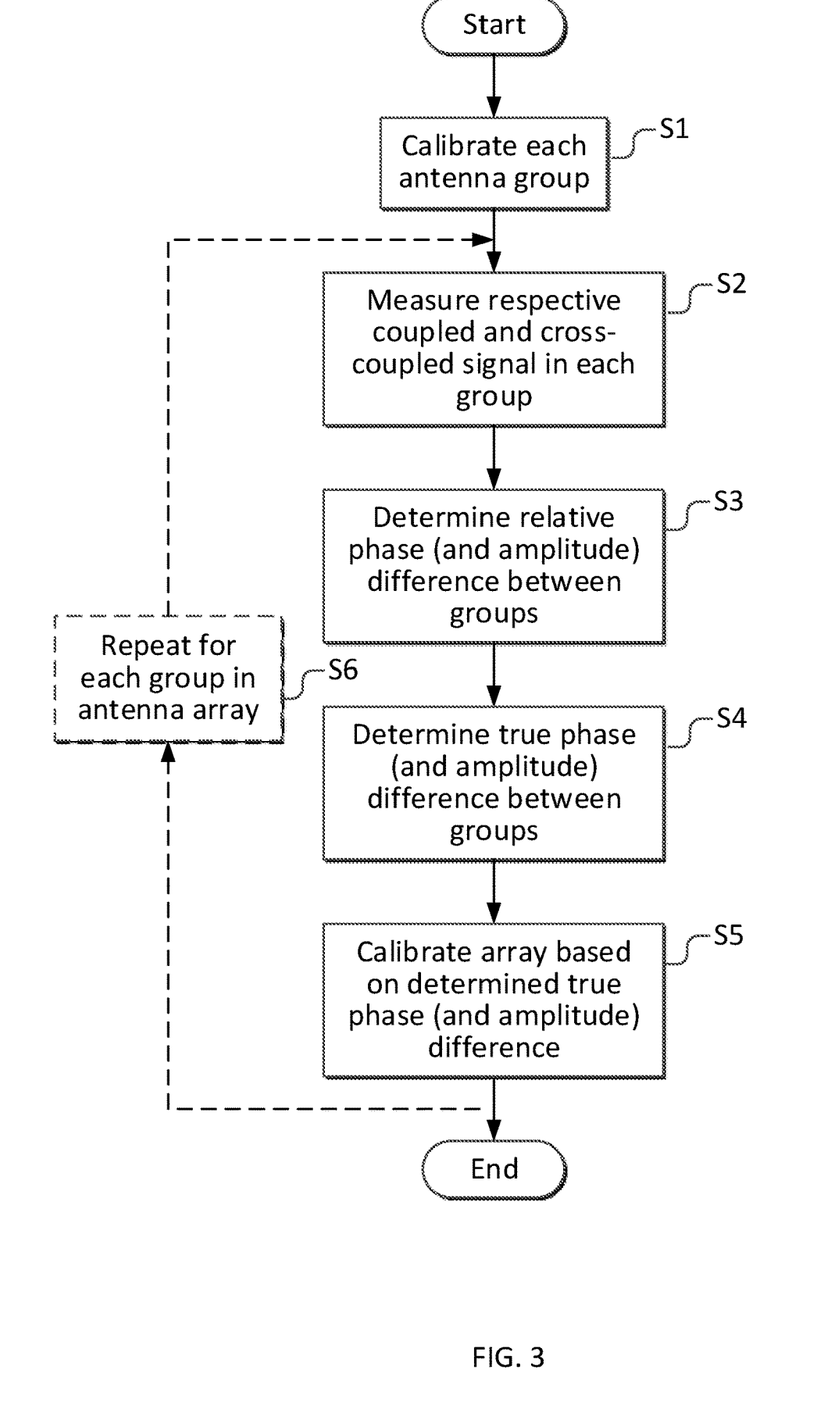
FIG. 3 is a flow chart illustrating an embodiment of the current disclosure.

With reference to FIG. 2-FIG. 3, a method according to the present disclosure will be described. The system in which the embodiment can be employed comprises an active antenna system 100 including at least two antenna element groups, Group A; Group B. The two antenna element groups can constitute two separate antennas, or constitute antenna elements forming an antenna array. The antenna elements within each group are in communication with a respective calibration coupler 12A, 12B, which is adapted to calibrate all antenna elements within each group. Further, the at least two antenna element groups are cross-coupled via cross coupling wire or means. In addition, each antenna element group is associated with a calibration transceiver unit, Cal-TRX, 14A, 14B and according to a particular embodiment the cross coupling is effectuated by cross coupling the calibration transceiver of one antenna element group with the calibration transceiver of the other antenna element group. According to one embodiment, but not solely, the cross coupling is effectuated via one or more switches interconnecting the respective calibration couplers, the cross coupler and the calibration transceiver. According to another embodiment, the cross coupling is effectuated via one or more Wilkinson splitters/combiners interconnecting the respective calibration couplers, the cross coupler and the calibration transceiver. According to known measures, a digital ASIC unit 15A, 15B is associated with each antenna element group, or shared between the at least two antenna element groups (as indicated by the dotted box in FIG. 1).

In order to enable calibrating the at least two cross coupled antenna element groups Group A, Group B with each other, according to an embodiment, the following steps are performed.

Firstly, in step S1, the antenna elements within each of the at least two groups of antenna elements are calibrated, and a calibrated coupled signal is provided. The fact that one antenna group is calibrated means that the signals from each transmitter of that group is in-phase and in-amplitude. Therefore, the parameter $t_x$ in the below section is common for all transmitters constituting the calibration group. This step could be performed in conjunction with the present embodiment, or be performed prior to or disjoint from the present embodiment. According to another embodiment, the step of calibrating the antenna elements within each group could be performed by a separate entity and the calibrated coupled signal can be provided as an input to the calibration apparatus of the current embodiment.

Subsequently, in a respective calibration transceiver 14A, 14B in each of the at least two groups, measuring S2 a coupled signal $Y_{11}$, $Y_{22}$ within each group and a cross-coupled signal $Y_{12}$, $Y_{21}$ between the at least two groups. In other words, firstly or measuring a coupled signal from a first of the at least two groups of antenna elements and a cross coupled signal from a second of the at least two groups of antenna elements, and secondly, measuring a coupled signal from the second of the at least two groups of antenna elements and a cross coupled signal from the first of the at least two groups. These measurements can be performed sequentially or simultaneously.

According to a particular embodiment the measuring step S2 comprises measuring the respective coupled and cross coupled signals sequentially for a first and a second switching state State 1, State 2 by switching to a first state, State 1, to enable measuring a coupled signal $Y_{11}$ in Group A and a cross coupled signal $Y_{21}$ originating in Group B, and switching to a second state, State 2, to enable measuring a coupled signal $Y_{12}$ in Group B and a cross coupled signal $Y_{22}$ originating in Group A.

According to a further embodiment, the measuring step S2 comprises measuring the respective coupled and cross-coupled signals simultaneously for the two antenna groups.

Further, determining S3 a respective relative phase and amplitude difference between the at least two groups based on the respective measured coupled signal $Y_{11}$, $Y_{21}$ and respective measured cross-coupled signal $Y_{12}$, $Y_{22}$.

According to a particular embodiment, this can be performed by determining a ratio or difference between the coupled and cross coupled signals for each respective state or antenna group, e.g. determine a ratio between coupled and cross coupled signal for State 1 and determine a ratio between coupled and cross coupled signal for State 2. Depending on the system, this ratio or difference could be compensated with a multiplier or other parameter.

Then, determining S4 the true phase and amplitude difference between the at least two groups based on the determined respective relative phase and amplitude differences, and finally calibrating S5 the at least two antenna groups based on the determined true phase and amplitude difference.

According to a particular embodiment, this determination could be based on a comparison of the ratio of the coupled and cross coupled signals for each state or antenna groups, e.g. a ratio between the ratios of the two states. Depending on the system, this ratio or difference could be compensated with a multiplier or other parameter.

In case of a system comprising more than two cross coupled antenna element groups, the above described steps can be repeated, in step S6, for each successive antenna element group in the antenna array to calibrate the whole antenna array.

The above described steps can be performed by a dedicated calibration apparatus 10, as indicated in FIG. 1 and FIG. 2, or performed by an adapted digital radio unit, as indicated by the dotted box in FIG. 1 and FIG. 2. Briefly, in a first switching state 1, measurement of relative phase differences is performed by Cal TRX circuitry 14A in antenna group A. In state 2, switches are shifted and measurement of relative phase differences is performed by Cal TRX circuitry 14B in group B. In case of using Wilkinson splitters/combiners, all measurements can be performed at the same time without necessitating any switching of state.

In a particular embodiment, in relation to FIG. 1 and FIG. 2, the subsequent steps are done. In this exemplary embodiment there are two antenna element groups, but it can be easily adapted to an array of multiple antenna element groups or separate antenna. Although the embodiment is described with relation to a DL (transmitter) calibration procedure, it can be understood that the same procedure can be applied to a UL (receiver) calibration. It can also be understood that the same principle can be applied to calibrate amplitude as well as phase.

The below described embodiment relates to a narrow band calibration where $t_x/t_y$ is calibrated within a narrow band spectrum. A corresponding broad band calibration is achieved by calculating $t_x/t_y$ across the entire frequency band.

In this context Cal TRX means a calibration transmitter/receiver that can transmit a calibration signal or receive a calibration signal. The Cal TRX can be a special circuit, (typically used for FDD systems), or re-using TX low-level and RX back-end (typically done in TDD systems).

In the below the following notations are used:
$t_x$=the impact on the transmitted signal amplitude and phase from transmitter of group x, complex number. For a pre-calibrated antenna group $t_x$ is equal for all antenna paths constituting the group. This means that $t_x$ can be represented by one antenna of the group, or all antennas.
$r_x$=the impact on the received signal amplitude and phase from receiver of group x. Complex number
$C_{xy}$=the impact on signal amplitude and phase from the signal transition from coupler means of antenna group x to the receiver in antenna group y
Cxx=the impact on signal amplitude and phase from the signal transition from coupler means of antenna group x to the receiver of the same antenna group.

The goal of the cross-calibration is that tx=ty or equivalently tx/ty=1. Under this condition, the transmit paths will be equal for the different antenna groups.

The below example is described with relation to an implementation using switches, in other words the cross coupler units 13A and 13B comprise switches or switching units, where each switching state enables measuring a coupled and cross coupled signal for a particular antenna group. In other words, each antenna group measurement corresponds to a particular switching state. However, in case of an implementation using splitters/combiners or in case there are two cross coupling wires, the measurements are performed simultaneously, but the measurements and ratios determined correspond to the ones determined for the switching implementation.

Accordingly, the embodiment comprises the following procedure:
1. Firstly, calibrate, in step S1, the antenna elements of each antenna group individually by using the coupler means 12A; 12B and the Cal TRX circuitry 14A; 14B existing in each antenna group Group A, Group B.

Subsequently, the coupled and cross coupled signals are measured S2 according to the following sequence. In this embodiment the measurements are enabled by means of switches that are set in a first or second state State 1, State 2, however, it is equally plausible to employ some other means of performing the same measurements. One way would be to have the above mentioned two cross couplings, thus enabling the two calibration transceivers to work in parallel instead of in series, or a system of Wilkinson splitters/combiners also enabling the two calibration transceivers to work in parallel.

2. Secondly, set switches 13A; 13B according to State 1. At the antenna group 1 receiver, measure the coupled signal $Y_{11}$ from antenna group 1 and the cross coupled signal from antenna group 2 $Y_{21}$.

$$Y_{11}=t_1C_{11}r_1, \text{ and}$$

$$Y_{21}=t_2C_{21}r_1,$$

Calculate the ratio (meaning the difference) of the measured results according to Equation (1) below:

$$\frac{Y_{11}}{Y_{21}} = \frac{t_1 C_{11} r_1}{t_2 C_{21} r_1} = \frac{t_1 C_{11}}{t_2 C_{21}} \quad (1)$$

Where the last step means that the impact from the receiver circuitry is taken away, because the same receiver is used for both measurements.

3. Thirdly, set switches according to State 2. At the antenna group 2 receiver, measure the cross coupled signal from antenna group 1, $Y_{21}$, and the coupled signal from antenna group 2, $Y_{22}$. The respective signals can be represented according to $Y_{12} = t_1 C_{12} r_2$, and $Y_{22} = t_2 C_{22} r_2$, Calculate the ratio (meaning the difference) of the measured results according to Equation (2) below:

$$\frac{Y_{22}}{Y_{12}} = \frac{t_2 C_{22} r_2}{t_1 C_{12} r_2} = \frac{t_2 C_{22}}{t_1 C_{12}} \quad (2)$$

4. Finally, calculate the ratio of the two results from Equation (1) and Equation (2), according to Equation (3) below:

$$\frac{\frac{Y_{11}}{Y_{21}}}{\frac{Y_{22}}{Y_{12}}} = \frac{\frac{t_1 C_{11}}{t_2 C_{21}}}{\frac{t_2 C_{22}}{t_1 C_{12}}} = \left(\frac{t_1}{t_2}\right)^2 \frac{C_{11}}{C_{22}} \frac{C_{12}}{C_{21}} \quad (3)$$

Assume now that the signal paths internal to the antenna groups have been designed carefully so that $C_{11} = C_{22}$. Also assume that $C_{21} = C_{12}$, which means that the signal transition between groups is reciprocal.

Then Equation (3) becomes simply $$\frac{\frac{Y_{11}}{Y_{21}}}{\frac{Y_{22}}{Y_{12}}} = \left(\frac{t_1}{t_2}\right)^2$$

Solving for $t_1/t_2$ which is the difference between transmitted signals in groups 1 and 2, the desired calibration result, renders Equation (4) below:

$$\frac{t_1}{t_2} = \pm \sqrt{\frac{\frac{Y_{11}}{Y_{21}}}{\frac{Y_{22}}{Y_{12}}}} \quad (4)$$

With this results, the true phase and amplitude difference between the antenna groups are known and the appropriate calibration compensation can be applied. Meaning that the calibration result is rendered from the four measurements, with no explicit knowledge of the actual signal transitions in the cross-coupling path.

Equation (4) indicates there is a phase ambiguity in the result, two unique solution exist to the equation, 180 degrees out-of-phase to each other.

A simple operation including a basic knowledge about ratio of the electrical length of the internal and cross coupled path solves this. Applying the two solutions to Equation (4) into Equation (1) gives two values of the ratio between the signal transition paths $C_{11}$ and $C_{12}$:

$$\frac{C_{11}}{C_{21}} = \frac{Y_{11}}{Y_{21}} \frac{1}{\frac{t_1}{t_2}} \quad (5)$$

Since the two solutions to Equation (4) are 180 degrees apart, only a very limited knowledge about $C_{11}/C_{21}$ is needed. The correct solution to Equation (4) is the one that evaluates Equation (5) closest to the known result. The knowledge about the $C_{11}/C_{21}$ ratio can be known either by design or by a production calibration measurement.

Groups in this context can be groups of one physical antenna array, or different physical antennas.

In the above both the phase and the amplitude difference is determined, however, according to a further embodiment, it is also possible to determined only the phase difference. Below follows an example of how this may be performed.

1. Calibrate each antenna group individually by using the coupler means and the Cal TRX circuitry existing in each antenna group.
2. Set switches according to state 1. Measure phase difference between transmitted signals from antenna group A and B measured at cal TRX circuitry in group A. It can be chosen to measure all antennas simultaneously by applying orthogonal calibration signals, or to measure one antenna at a time by applying signal to one antenna at a time. The measured phase difference is affected by the phase of the coupler means and can be written as:

$\Delta\theta_{meas1} = \theta_A + \varphi_{A1} - (\theta_B + \varphi_{B1}) = \Delta\theta_{true} + \varphi_{A1} - \varphi_{B1}$ (6)

3. Set switches according to state 2. Measure phase difference between transmitted signals from antenna group A and B measured at cal TRX circuitry in group B. The measured phase difference can be written as:

$\Delta\theta_{meas2} = \theta_A + \varphi_{A2} - (\theta_B + \varphi_{B2}) = \Delta\theta_{true} + \varphi_{A2} - \varphi_{B2}$ (7)

4. Perform the following calculations

The difference of meas 1 and 2 can be simplified to $\Delta\theta_{meas1} - \Delta\theta_{meas2} = \varphi_{A1} - \varphi_{B1} - (\varphi_{A2} - \varphi_{B2})$ Assume: $\varphi_{A1} = \varphi_{B2}$ and $\varphi_{A2} = \varphi_{B1}$ $\Rightarrow \Delta\theta_{meas1} - \Delta\theta_{meas2} = \varphi_{A1} - \varphi_{B1} - (\varphi_{B1} - \varphi_{A1}) = 2(\varphi_{A1} - \varphi_{B1})$ So that $\varphi_{A1} - \varphi_{B1} = \frac{1}{2}(\Delta\theta_{meas1} - \Delta\theta_{meas2})$ (8)

Apply (3) into (1)

$\Delta\theta_{meas1} = \Delta\theta_{true} + \frac{1}{2}(\Delta\theta_{meas1} - \Delta\theta_{meas2})$ $\Delta\theta_{true} = \Delta\theta_{meas1} - \frac{1}{2}(\Delta\theta_{meas1} - \Delta\theta_{meas2}) = \frac{1}{2}(\Delta\theta_{meas1} + \Delta\theta_{meas2})$ (9)

Which gives the desired true phase difference without the specific knowledge of the phase through the cross-coupled path. The only assumption made is that the cross-coupled path has to be reciprocal, meaning that the through phase is the same in both directions.

In the above described embodiments, the different cross coupled signals are measured for two states, which are achieved by means of one or more switching arrangements at each antenna group. However, it is, according to a further embodiment, possible to perform the calibration measurements by means of an arrangement of Wilkinson-splitters/combiners that enable measuring the ratio between a coupled signal and the cross coupled signal for each group at the same time. An advantage of this being that no switching action between two states is necessary, instead all measurements can be performed for the antenna groups more or less simultaneously.

According to a further embodiment, two cross-couplings are provided between the two antenna groups, thus enabling measuring the coupled and cross coupled signals in parallel.

Figure 4:
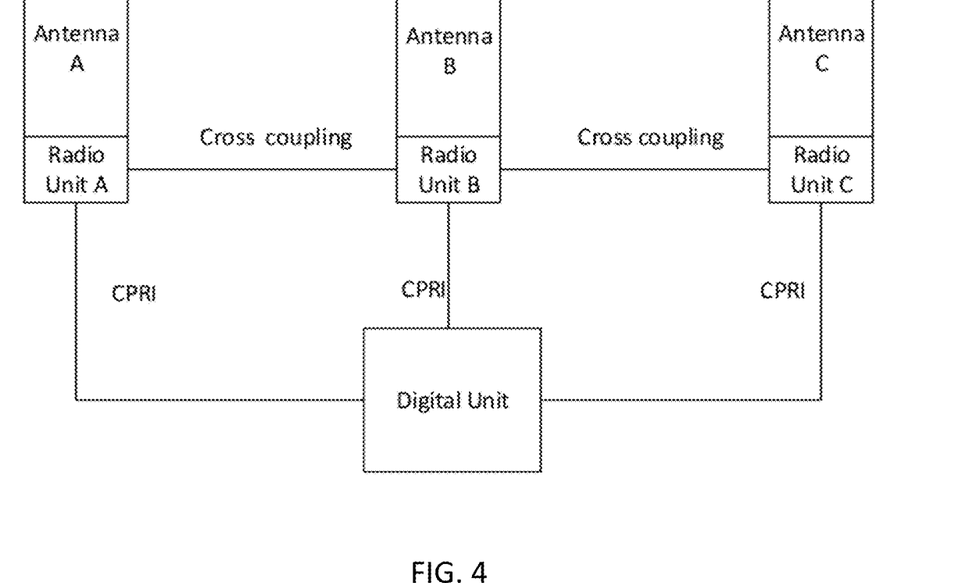
FIG. 4 illustrates another embodiment of the current disclosure.

With reference to FIG. 4, the above described calibration method can be applied also to physically separated antenna groups, each of them served by its own radio circuitry. The figure shows an example of three physically separated antennas. The three antenna systems can be calibrated together using the cross-antenna calibration method and thereby provide coherent multi-point (coherent D-MIMO) transmission.

Figure 5:
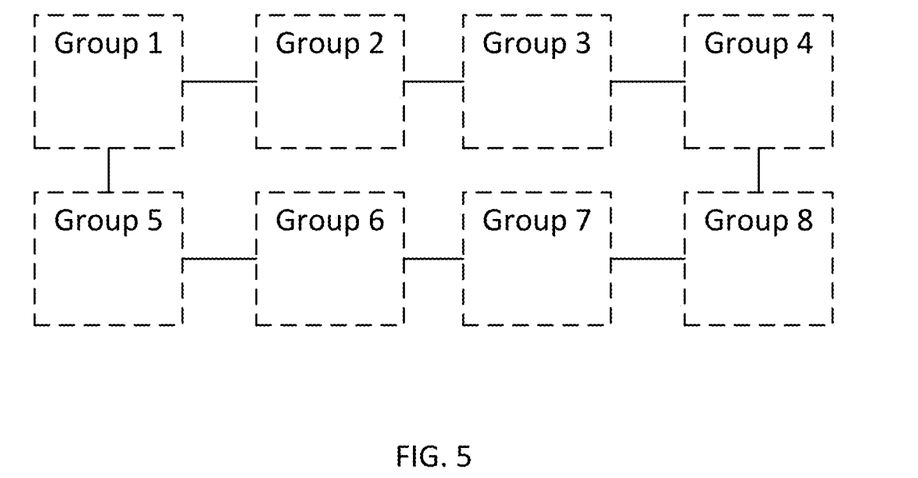
FIG. 5 illustrates another embodiment of the current disclosure.

One particular embodiment will be described with reference to FIG. 5, which comprises an antenna array containing multiple cross coupled antenna groups. In the illustrated embodiment, there are 8 antenna groups, however the same strategy can be implemented for antenna arrays of any size. In the schematic illustration in FIG. 5, there is depicted a 64-antenna array (8×8 antenna groups) with cross coupling paths between them. The cross-connections in a ring formation allows for a full calibration of the large 64-antenna array. Thereby, the previously described method of calibrating two antenna groups, can be successively repeated to each group and its neighbour, until all antenna element groups have been calibrated. In other words, wherein the antenna array comprises more than two cross coupled antenna element groups and the method comprising repeating the steps for each successive antenna element group in the antenna array to calibrate the whole antenna array.

Figure 6:
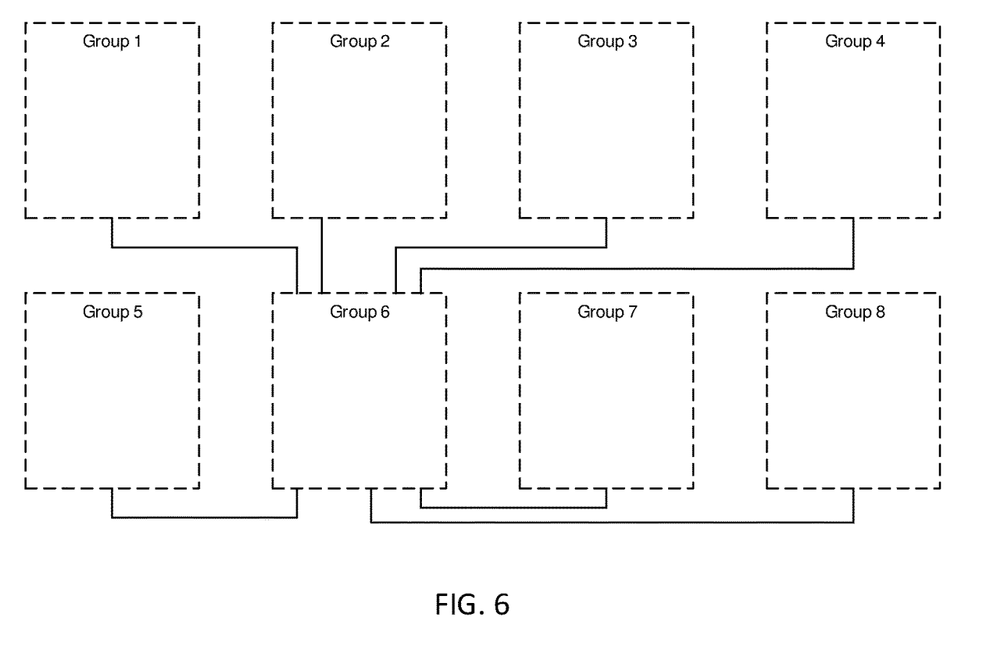
FIG. 6 illustrates a further embodiment of the current disclosure.

The same result can be obtained using a star-configuration, as illustrated in FIG. 6, where each antenna group is calibrated towards one group. With this configuration, each antenna group is calibrated towards the same reference antenna group, which may result in a better accuracy, because possible systematic error sources do not propagate and add up, which can be the case in a ring configuration.

The essence is a method to calibrate large arrays by using local subarray coupler means and calibration transmitter/receiver. The cross-measurement system and method then calibrates the groups to each other and calibrates the full array.

Figure 7:
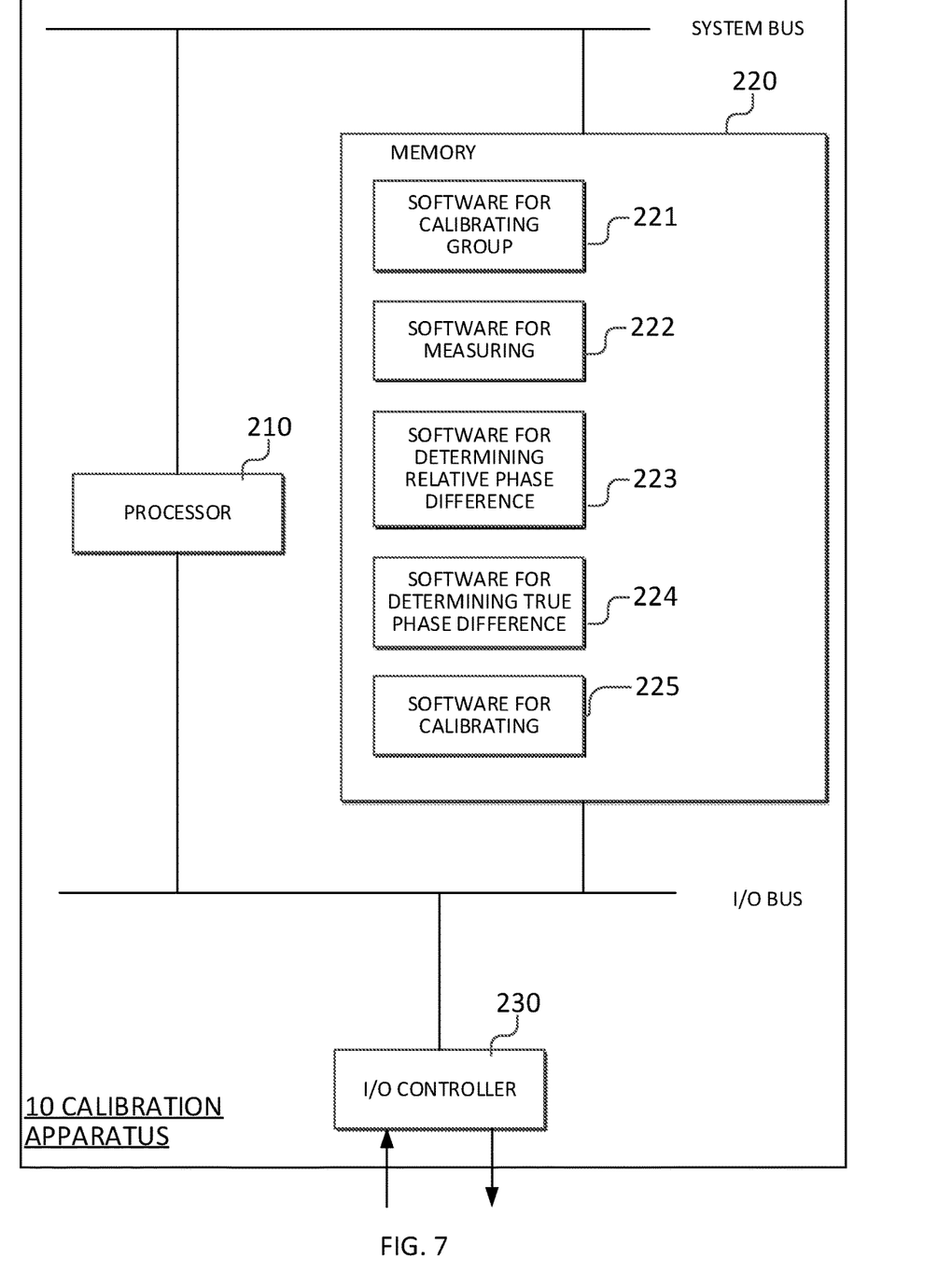
FIG. 7 illustrates another embodiment of the current disclosure.

With reference to FIG. 7, the proposed technology provides a calibration apparatus 10 configured to calibrate at least two groups of cross coupled antenna elements Group A; Group B in an antenna array 100, wherein the apparatus 10 is configured to calibrate each group of antenna elements Group A; Group B, and in a respective calibration transceiver 14A, 14B connectable to each group Group A; Group B, measure a coupled signal within each group and a cross-coupled signal originating in another of the at least two groups. Further, the calibration apparatus 10 is configured to determine a respective relative phase and amplitude difference between the at least two groups based on the respective measured coupled signal and the cross-coupled signal, and to determine the true phase and amplitude difference between the at least two groups based on the respective determined relative phase and amplitude difference. Finally, the calibration apparatus 10 is configured to calibrate the at least two antenna groups based on the thus determined true phase and amplitude difference.

In addition, the apparatus 10 is configured to perform the steps of the previously described embodiments of a calibration method.

According to a further embodiment, the calibration apparatus 10 is configured to, in case the antenna array system 100 comprises more than two cross coupled antenna element groups, to repeat the calibration steps for each successive antenna element group in the antenna array to enable calibrating the whole antenna array. The calibration apparatus 10 can be configured to calibrate multiple cross coupled antenna groups that are cross coupled in a circular configuration or in a star configuration. In the latter case, the apparatus 10 is configured to calibrate all antenna groups relative one common antenna group.

Yet another embodiment comprises an active antenna system 100 which is adapted to perform the steps of the calibration apparatus 10, or is configured to include a calibration apparatus 10 according to the above. The active antenna system 100, can constitute part of a remote radio unit, or part of a radio base station or network node.

As used herein, the non-limiting term "radio network node" may refer to base stations, network control nodes such as network controllers, radio network controllers, base station controllers, and the like. In particular, the term "base station" may encompass different types of radio base stations including standardized base stations such as Node Bs, or evolved Node Bs, eNBs, and also macro/micro/pico radio base stations, home base stations, also known as femto base stations, relay nodes, repeaters, radio access points, base transceiver stations, BTSs, and even radio control nodes controlling one or more Remote Radio Units, RRUs, or the like.

Optionally, network node may also include communication circuitry. The communication circuitry may include functions for wired and/or wireless communication with other devices and/or network nodes in the network. In a particular example, network node may include radio circuitry for communication with one or more other nodes, including transmitting and/or receiving information. The communication circuitry may be interconnected to the processor and/or memory.

It will be appreciated that the methods and devices described herein can be combined and re-arranged in a variety of ways.

For example, embodiments may be implemented in hardware, or in software for execution by suitable processing circuitry, or a combination thereof.

The steps, functions, procedures, modules and/or blocks described herein may be implemented in hardware using any conventional technology, such as discrete circuit or integrated circuit technology, including both general-purpose electronic circuitry and application-specific circuitry.

Particular examples include one or more suitably configured digital signal processors and other known electronic circuits, e.g. discrete logic gates interconnected to perform a specialized function, or Application Specific Integrated Circuits (ASICs).

Alternatively, at least some of the steps, functions, procedures, modules and/or blocks described herein may be implemented in software such as a computer program for execution by suitable processing circuitry such as one or more processors or processing units.

Examples of processing circuitry includes, but is not limited to, one or more microprocessors, one or more Digital Signal Processors (DSPs), one or more Central Processing Units (CPUs), video acceleration hardware, and/or any suitable programmable logic circuitry such as one or more Field Programmable Gate Arrays (FPGAs), or one or more Programmable Logic Controllers (PLCs).

It should also be understood that it may be possible to re-use the general processing capabilities of any conventional device or unit in which the proposed technology is implemented. It may also be possible to re-use existing software, e.g. by reprogramming of the existing software or by adding new software components.

In a particular example, the apparatus comprises a processor and a memory, said memory comprising instructions executable by the processor, whereby the apparatus/processor is operative to [repeat the above to functions, steps, actions].

FIG. 7 is a schematic block diagram illustrating an example of a calibration arrangement 10 comprising a processor 210, an associated memory 220, a I/O controller 230, in addition to both input bus and I/O bus.

In this particular example, at least some of the steps, functions, procedures, modules and/or blocks described herein are implemented in a computer program, which is loaded into the memory 220 for execution by processing circuitry including one or more processors 210. The processor(s) 210 and memory 220 are interconnected to each other to enable normal software execution. An optional input/output device 230 may also be interconnected to the processor(s) 210 and/or the memory 220 to enable input and/or output of relevant data such as input parameter(s) and/or resulting output parameter(s). In the current embodiments, the input parameters may comprise the coupled and cross coupled signals, and the output parameters may comprise the calibrated antenna signals.

The term 'processor' should be interpreted in a general sense as any system or device capable of executing program code or computer program instructions to perform a particular processing, determining or computing task.

The processing circuitry including one or more processors is thus configured to perform, when executing the computer program, well-defined processing tasks such as those described herein.

The processing circuitry does not have to be dedicated to only execute the above-described steps, functions, procedure and/or blocks, but may also execute other tasks.

In a particular embodiment, the computer program comprises instructions, which when executed by at least one processor, cause the processor(s) to calibrate S1 the antenna elements within each group of antenna elements, and in a respective calibration transceiver in each group, measure S2 a coupled signal within each group and a cross-coupled signal originating in another of the at least two groups. Further, the computer program causes the processor(s) to determine S3 a respective relative phase and amplitude difference between the at least two groups based on the measured coupled signal and the cross-coupled signal. Finally, the processor(s) is caused to determine S4 the true phase and amplitude difference between the at least two groups based on said determined respective relative phase and amplitude differences, and calibrate S5 the at least two antenna groups based on said determined true phase and amplitude difference.

By way of example, the software or computer program may be realized as a computer program product, which is normally carried or stored on a computer-readable medium, in particular a non-volatile medium. The computer-readable medium may include one or more removable or non-removable memory devices including, but not limited to a Read-Only Memory (ROM), a Random Access Memory (RAM), a Compact Disc (CD), a Digital Versatile Disc (DVD), a Blu-ray disc, a Universal Serial Bus (USB) memory, a Hard Disk Drive (HDD) storage device, a flash memory, a magnetic tape, or any other conventional memory device. The computer program may thus be loaded into the operating memory of a computer or equivalent processing device for execution by the processing circuitry thereof.

The flow diagram or diagrams presented herein may therefore be regarded as a computer flow diagram or diagrams, when performed by one or more processors. A corresponding calibration apparatus 10 or network node comprising the calibration apparatus 10 may be defined as a group of function modules, where each step performed by the processor corresponds to a function module. In this case, the function modules are implemented as a computer program running on the processor. Hence, the network node may alternatively be defined as a group of function or software modules, where the function modules are implemented as a computer program running on at least one processor. Consequently, the calibration apparatus 10 may comprise a module 221 for calibrating the antenna elements within each group of antenna elements, and in a respective calibration transceiver in each group, and a module 222 for measuring a coupled signal within each group and a cross-coupled signal originating in another of the at least two groups. Further, the calibration apparatus 10 may comprise a module 223 for determining a respective relative phase and amplitude difference between the at least two groups based on the measured coupled signal and the cross-coupled signal. Finally, the calibration apparatus 10 may comprise a module 224 for determining the true phase and amplitude difference between the at least two groups based on said determined respective relative phase and amplitude differences, and a module 225 for calibrating the at least two antenna groups based on the thus determined true phase and amplitude difference.

The computer program residing in memory may thus be organized as appropriate function modules configured to perform, when executed by the processor, at least part of the steps and/or tasks described herein.

The method can be applied also to calibrate physically separated antennas towards each other.

Some of the benefits of the embodiment of the current disclosure include:
- Enabling local calibration of each antenna group combined with a full calibration of the full array.
- No routing of coupled signals to a common point is needed. Only routing of signal between antenna groups is needed, which is a much simpler problem to solve. Also, no explicit knowledge of the cross signal routing amplitude and phase is needed, which simplifies the design of the full antenna array.
- Full amplitude and phase calibration between physically separated antennas is enabled The embodiments described above are merely given as examples, and it should be understood that the proposed technology is not limited thereto. It will be understood by those skilled in the art that various modifications, combinations and changes may be made to the embodiments without departing from the present scope as defined by the appended claims. In particular, different part solutions in the different embodiments can be combined in other configurations, where technically possible.

The invention claimed is:

1. A method for calibrating at least two cross coupled antenna element groups in an antenna system comprising a first antenna element group, a second antenna element group, a first calibration transceiver, and a second calibration transceiver, wherein the first antenna element group comprises a first group of antenna elements and the second antenna element group comprises a second group of antenna elements, the method comprising:
- calibrating the first group of antenna elements;
- calibrating the second group of antenna elements;
- the first calibration transceiver receiving a first signal from the first group of antenna elements and a second signal from the second group of antenna elements and determining a first relative difference between the first and second signals;
- the second calibration transceiver receiving a third signal from the first group of antenna elements and a fourth signal from the second group of antenna elements and determining a second relative phase difference between the third and fourth signals;
- determining a true phase difference between the first group of antenna elements and the second group of antenna elements based on said determined first and second relative phase differences; and
- calibrating the first and second group of antenna elements based on said determined true phase difference.

2. The method of claim 1, wherein determining the first relative difference between the first and second signals comprises determining:
- a first ratio of the first and second signals, or
- a first difference between the first and second signals.

3. The method of claim 1, wherein determining the second relative difference between the third and fourth signals comprises determining:
- a second ratio of the third and fourth signals, or
- a second difference between the third and fourth signals.

4. The method of claim 1, wherein determining the true phase difference comprises:
- comparing the first ratio with the second ratio, or
- comparing the first difference with the second difference.

5. The method of claim 1, wherein determining the true phase difference comprises calculating:
- R=R1/R2, where R1 is the first ratio and R2 is the second ratio.

6. The method of claim 1, wherein the third signal is the first signal and the fourth signal is the second signal.

7. The method of claim 1, further comprising:
- prior to the first calibration transceiver receiving the first signal, configuring a first switch to connect the first calibration transceiver to a first coupler and configuring a second switch to connect the first calibration transceiver to a third switch, wherein the first coupler is connected to each antenna element in the first group of antenna elements; and
- prior to the first calibration transceiver receiving the second signal, configuring the third switch to connect the first calibration transceiver to a second coupler, wherein the second coupler is connected to each antenna element in the second group of antenna elements.

8. The method of claim 7, further comprising:
- prior to the second calibration transceiver receiving the fourth signal, configuring a fourth switch to connect the second calibration transceiver to a second coupler and configuring the third switch to connect the second calibration transceiver to the second switch, wherein the first coupler is connected to each antenna element in the first group of antenna elements.

9. An antenna system, the antenna system comprising:
- a first antenna element group comprising a first group of antenna elements;
- a second antenna element group comprising a second group of antenna elements;
- a first calibration transceiver for determining a first relative difference between a first signal received from the first group of antenna elements and a second signal received from the second group of antenna elements; and
- a second calibration transceiver for determining a second relative difference between a third signal received from the first group of antenna elements and a coupled signal received from the second group of antenna elements, wherein
- said system is configured to:
- determine a true phase difference between the first group of antenna elements and the second group of antenna elements based on said determined first and second relative phase differences; and
- calibrate the first and second group of antenna elements based on said determined true phase difference.

10. The antenna system of claim 9, wherein the antenna system is configured to determine the first relative difference between the first and second signals by determining:
- a first ratio of the first and second signals, or
- a first difference between the first and second signals.

11. The antenna system of claim 10, wherein the antenna system is configured to determine the second relative difference between the third and fourth signals by determining:
- a second ratio of the third and fourth signals, or
- a second difference between the third and fourth signals.

12. The antenna system of claim 9, wherein the antenna system is configured to determine the true phase difference by:
- comparing the first ratio with the second ratio, or
- comparing the first difference with the second difference.

13. The antenna system of claim 9, wherein the antenna system is configured to determine the true phase difference by calculating:
- R=R1/R2, where R1 is the first ratio and R2 is the second ratio.

14. The apparatus of claim 9, wherein the third signal is the first signal and the fourth signal is the second signal.

15. A network node comprising the active antenna system of claim 9.

* * * * *